United States Patent [19]
Takasu

[11] Patent Number: 5,402,989
[45] Date of Patent: Apr. 4, 1995

[54] METHOD FOR MANUFACTURING SEMICONDUCTOR DEVICE HAVING GROWN LAYER ON INSULATING LAYER

[75] Inventor: Hidemi Takasu, Kyoto, Japan

[73] Assignee: Rohm Co., Ltd., Kyoto, Japan

[21] Appl. No.: 180,756

[22] Filed: Jan. 10, 1994

Related U.S. Application Data

[63] Continuation of Ser. No. 769,270, Oct. 1, 1991, abandoned.

[30] Foreign Application Priority Data

Jun. 11, 1991 [JP] Japan .................. 3-138742

[51] Int. Cl.$^6$ ............................................. H01L 27/12
[52] U.S. Cl. ........................................ 257/506; 257/74
[58] Field of Search .................. 257/506, 510, 374, 74

[56] References Cited

U.S. PATENT DOCUMENTS 5,040,043   8/1991   Ohno et al. .................. 257/506

FOREIGN PATENT DOCUMENTS

| 62-42511  | 2/1987 | Japan . |
| 62-45042  | 2/1987 | Japan . |
| 63-192223 | 8/1988 | Japan . |
| 2-5517    | 1/1990 | Japan . |

OTHER PUBLICATIONS

"Lateral Epitaxial Overgrowth of Silicon on SiO$_2$", Journal of Electrochemical Society Solid–State Science and Technology, by D. D. Rathman et al, Oct. 1982, pp. 2303–2306.

"New SOI–Selective Nucleation Epitaxy", Preliminary Bulletin for the 48th Fall Academic Lecture 1987 by the Applied Physics Society, 19p-Q-15, by Ryudai Yonehara et al, p. 583.

Primary Examiner—Gene M. Munson
Attorney, Agent, or Firm—Lowe, Price, LeBlanc & Becker

[57] ABSTRACT

A semiconductor device is manufactured by forming an epitaxial layer 22 insulated from a silicon substrate 2, and forming a device in the epitaxial layer 22. On the semiconductor substrate 2, a silicon dioxide layer 4 is formed (FIG. 2A). Then the silicon dioxide layer 4 is provided with openings 14 (FIG. 2D). Silicon is grown until it protrudes from the openings 14 to thereby form a silicon seed crystal layer 16 (FIG. 2E). Next, a silicon nitride layer 18 is formed on the surface of the silicon seed crystal layer 16 and thereafter is oxidized. A field oxide layer 20 is thereby bonded at the lower portion of the openings 14, the silicon seed crystal layer 16 being insulated from the silicon substrate 2. Thereafter, epitaxial growth is effected from the silicon seed crystal layer 16, obtaining an epitaxially grown layer 22.

2 Claims, 6 Drawing Sheets

METHOD FOR MANUFACTURING SEMICONDUCTOR DEVICE HAVING GROWN LAYER ON INSULATING LAYER

This application is a continuation of application Ser. No. 07/769,270, filed Oct. 1, 1991, now abandoned.

BACKGROUND OF THE INVENTION

1. Field of the Invention

The present invention relates to methods for manufacturing semiconductor devices and, more particularly, to a method for manufacturing structures having a semiconductor layer on an insulating layer.

2. Description of the Prior Art

Semiconductor microchips or integrated circuits in general are provided in a structure in which an epitaxially grown layer is formed on a silicon substrate and circuits are then formed in the epitaxially grown layer. The silicon substrate and the epitaxially grown layer are joined together to form a pn junction. The resulting capacitance of the pn junction, however, is such that it reduces the operating speed of the device. Accordingly, this structure was not suitable for forming device requiring high-speed operation.

In the last few years, to solve this problem, a way of forming an additional silicon monocrystal layer to overlie the insulating layer on the silicon substrate (Semiconductor on Insulator, or SOI, technique) has been sought. This is to eliminate the pn junction between the semiconductor device formed on the silicon monocrystal layer and the silicon substrate, by insulating the silicon monocrystal layer from the silicon substrate.

FIG. 1 illustrates the conventional SOI technique using the ELO (Epitaxial Lateral Overgrowth) method ("Lateral Epitaxial Overgrowth of Silicon on SiO2," by D. D. Rathman et. al., JOURNAL OF ELECTROCHEMICAL SOCIETY SOLID-STATE SCIENCE AND TECHNOLOGY, October, 1982, p. 2303). First, a silicon dioxide layer 4 is grown on top of a semiconductor substrate 2. Then, the silicon dioxide layer 4 is etched using photoresist to thereby open seed windows 6 (see FIG. 1A). This is followed by selective epitaxial growth of silicon in the longitudinal direction from the seed windows 6, and, subsequently, lateral epitaxial growth, to form an epitaxial layer 8 on the silicon dioxide layer 4 (see FIG. 1B). By these processes, the pn junction between the epitaxial layer 8 and the silicon substrate 2 can be reduced in area to the size of the seed window 6, thus allowing the pn junction capacitance to be reduced and high-speed operation of the device to be realized.

Another method available is the SENTAXY method ("New SOI-Selective Nucleation Epitaxy," by Ryudai Yonehara et. al., Preliminary Bulletin for the 48th Fall Academic Lecture 1987 by the Applied Physics Society, 19p-Q-15, p. 583). In this method, a plurality of crystal-grown silicon nuclei are formed on an insulating layer of silicon dioxide or the like, further effecting epitaxial growth from each of the nuclei. Methods of forming the nuclei which are under discussion include formation of a small-area silicon nitride layer composed of the nuclei, or employment of the FIB (Focused Ion Beam) method. Using this method allows the epitaxial layer and the silicon substrate to be isolated from one another by an oxide layer, which will solve the aforementioned problems.

However, the conventional SOI technique described above would involve the following problem.

In the ELO method shown in FIG. 1, the junction, although reduced indeed, is not wholly eliminated. This would arrest further increase of the operating speed of the device.

In the SENTAXY method, on the other hand, the epitaxial layer and the silicon substrate are isolated from one another, thus overcoming the above problem. However, the SENTAXY method involves differentiation in the plane bearing of the epitaxial layer that grows from each of the nuclei. This differentiation in the plane bearing of the epitaxial layer will cause variation in oxidation rate and other characteristics, with the result that device having desired characteristics cannot be formed uniformly.

SUMMARY OF THE INVENTION

An object of the present invention, therefore, is to overcome the aforementioned problems and provide semiconductor device having a silicon grown layer which is isolated from the substrate by an insulating layer and uniform in plane bearing.

A method for manufacturing semiconductor device having a grown layer on an insulating layer in accordance with one embodiment of the present invention, comprises steps of:

an insulating layer formation step of forming an oxide insulating layer on a silicon substrate;

an opening formation step of providing the oxide insulating layer with an opening for seed crystal growth;

a seed crystal growth step of effecting crystal growth until the silicon seed crystal layer protrudes from the opening with the oxide insulating layer used as a mask;

a barrier formation step of forming a barrier layer on the protruding surface of the silicon seed crystal, the barrier layer having an oxidation rate sufficiently low as compared with that of the applicable silicon seed crystal layer;

a selective oxidation step of effecting oxidation with the barrier layer used as a barrier to oxidize the silicon seed crystal layer within the opening, thereby cutting off the connection between the silicon seed crystal layer and the silicon substrate;

a barrier removal step of making the silicon seed crystal layer exposed by removing the barrier layer;

a silicon growth step of subjecting the silicon grown layer to crystal growth on the basis of the silicon seed crystal layer; and a device formation step of forming a semiconductor device on the silicon grown layer.

A method for manufacturing a semiconductor device in accordance with another embodiment of the present invention, comprises steps of:

an insulating layer formation step of forming an oxide insulating layer on a silicon substrate;

an opening formation step of providing the oxide insulating layer with an opening for seed crystal growth;

a seed crystal growth step for effecting crystal growth until the silicon seed crystal layer protrudes from the opening with the oxide insulating layer used as a mask;

an insulating layer removal step of removing the oxide insulating layer;

an oxidation step of effecting oxidation to oxidize the silicon seed crystal layer within the opening with the seed crystal layer remaining in a quantity required for crystal growth, thereby cutting off the connection between the silicon seed crystal layer and the silicon substrate;

a silicon growth step of subjecting the silicon grown layer to crystal growth on the basis of the silicon seed crystal layer; and a device formation step of forming a semiconductor device on the silicon grown layer.

While the novel features of the invention are set forth in a general fashion, particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Figure 1A:
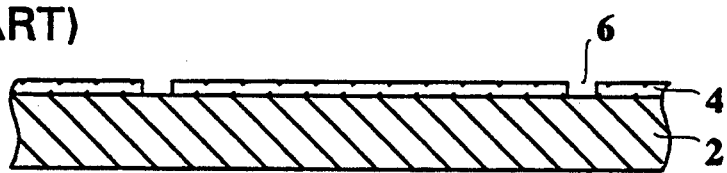
FIG. 1A-B is a view illustrating the conventional SOI (Semiconductor on Insulator) technique using the ELO (Epitaxial Lateral Overgrowth) method.
Figure 1B:
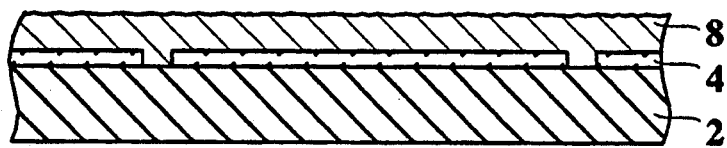

A method for manufacturing semiconductor device according to an embodiment of the present invention is shown in FIG. 2. First, a silicon substrate 2 is placed in an oxygen atmosphere, with temperature increased to high, thereby thermally oxidizing the substrate surface. As a result, a silicon dioxide layer 4 ($SiO_2$) serving as an oxide insulating layer is formed on the top of the silicon substrate 2, as shown in FIG. 2A. Preferably, the silicon dioxide layer 4 is formed thin, for example, approximately 30 to 300 nm thick. Next, as shown in FIG. 2B, photoresist 10 is applied onto the silicon dioxide layer 4. After a mask is placed on the photoresist 10 and exposed to ultraviolet rays, openings 12 are formed, as shown in FIG. 2C. In this state, with the photoresist 10 used as a mask, the silicon dioxide layer 4 is subjected to etching. Subsequently, the photoresist 10 is removed by use of a mixed liquid of sulfuric acid and hydrogen peroxide. Thus, openings 14 for seed crystal growth are formed, as shown in FIG. 2D. The width of the openings 14 is less than 2 μm.

Figure 2A:
FIG. 2A-F is a view illustrating the method for manufacturing semiconductor device which is an embodiment of the present invention.
Figure 2B:
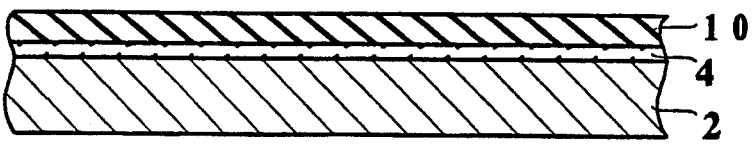
Figure 2C:
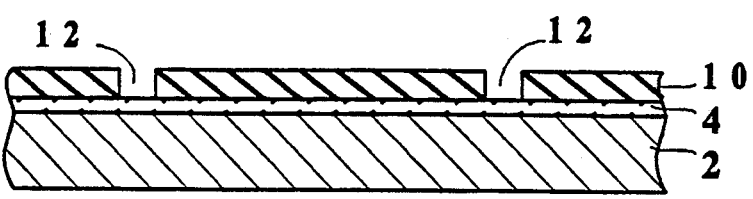
Figure 2D:
Figure 2E:

In the step shown in FIG. 2D, the openings 14 are selectively subjected to epitaxial growth of silicon monocrystal, so that seed crystal layers 16 are formed as shown in FIG. 2E. The epitaxial growth at this step is controlled so as to suppress lateral growth. The longitudinal growth is allowed to range approximately 1 to 4 μm, while the lateral growth is suppressed within 1 μm.

During growth of the seed crystal layer 16, there may arise stacking faults at the interface with the silicon dioxide layer 4. Due to this, the layer 4 of silicon dioxide is formed thin so as to reduce the interface area, as described above, to prevent stacking faults. Further, the epitaxial growth is preferably carried out at as low a temperature as possible, within the approximate range of 900° C. to 1100° C.; epitaxial growth carried out at such a low temperature will enable stacking faults to be suppressed. Moreover, when the silicon dioxide layer 4 is formed to a silicon substrate (100) in a rectangular pattern in the direction of <100>, stacking faults can be further suppressed. And still further, if a thin polysilicon or nitride silicon layer is added to the sidewall of the silicon dioxide layer 4 prior to the growth in order to improve the lattice consistency, the crystal faults can also be suppressed. Each of the seed crystal layers 16 formed by the above steps has the same plane bearing or crystal plane orientation.

Figure 2F:
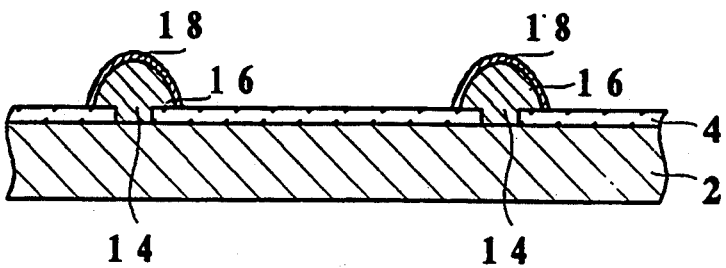
Figure 3A:
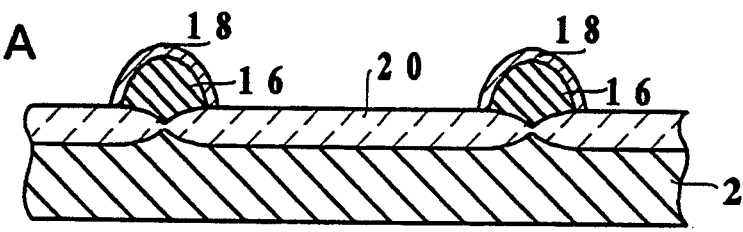
FIG. 3A-C is another view illustrating the method for manufacturing semiconductor device which is an embodiment of the present invention.

Next, as shown in FIG. 2F, the surface of the seed crystal layer 16 is nitrified to form silicon nitride layers 18 ($Si_3N_4$) as barrier layers. Oxidation-treatment follows this, thereby oxidizing the silicon dioxide layer 4 and the silicon substrate 2. In this treatment, the silicon nitride layer 18 functions to block the oxidation, preventing oxidation of the seed crystal layer 16. Meanwhile, the silicon dioxide layer 4 is oxidized to grow into a field oxide layer 20. The field oxide layer 20 also grows laterally at its ends forming a Bird's Beak structure which is defined by the tapered connection which forms between adjacent ends of the field oxide layer and beneath the seed crystal layer as shown in FIG. 3. In addition, as described earlier, the width of the openings 14 is as narrow as 2 μm or less. Accordingly, as shown in FIG. 3A, the field oxide layer 20 is connected with the seed crystal layer 16 at its lower portion.

Figure 3B:
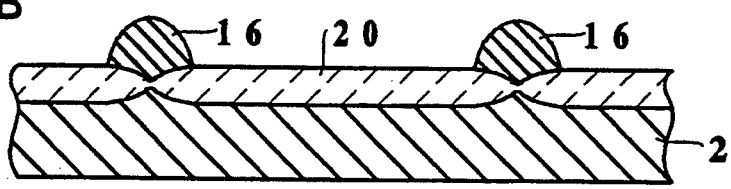

Subsequently, etching is performed using high-temperature phosphoric acid or the like to remove the silicon nitride layer 18 (see FIG. 3B). Thereafter, epitaxial growth is effected with the seed crystal layers 16 used as the seed crystal. The epitaxial growth at this step is controlled so as to increase lateral growth. As the growth continues, the layers grown out of each seed crystal layer 16 come to be connected to one another, resulting in the structure shown in FIG. 3C.

An epitaxially grown layer 22, which is a silicon grown layer, is isolated from the silicon substrate 2 by the field oxide layer 20. Accordingly, it generates no electrostatic capacitance due to the pn junction with the silicon substrate 2. This means that forming devices (e.g. transistors, FETs) in each epitaxially grown layer 22 will not cause any reduction in operating speed due to electrostatic capacitance, allowing high-speed device to be realized. Moreover, since no electrostatic capacitance is caused due to the pn junction, a good high-frequency characteristic and an enhanced latch-up characteristic can be obtained.

The plane bearing or crystal plane orientation of each seed crystal layer 16 is uniform and therefore that of the epitaxially grown layer 22 is also uniform. Accordingly, the oxidation rate is uniform, facilitating the control of device characteristics when forming devices in the epitaxially grown layer 22.

In this embodiment, the surface of the seed crystal layer 16 is nitrified to form the silicon nitride layer 18 and thereafter is oxidized. However, it may also be arranged that, subsequent to forming the silicon nitride layer 18, the silicon dioxide layer 4 is removed by etching and thereafter oxidation is effected. In this case, to make the seed crystal grown layer 16 in the opening 14, it is not necessary to suppress lateral growth.

Figure 4:
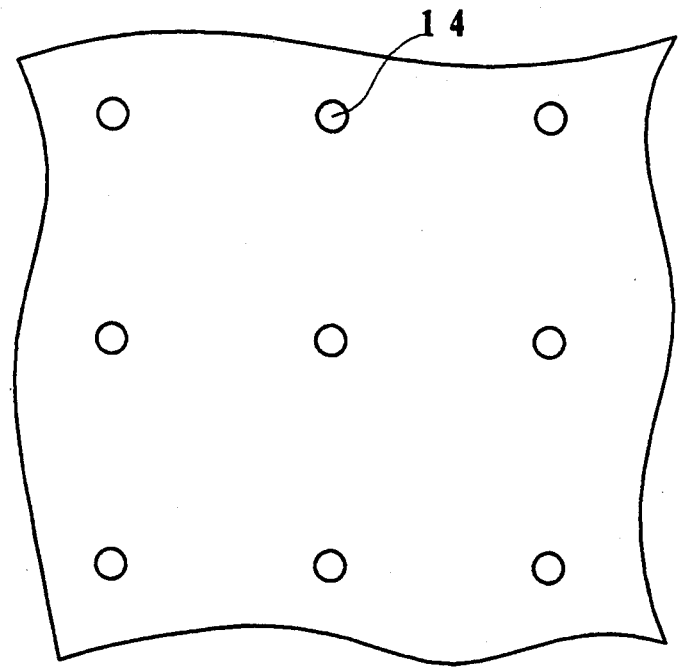
FIG. 4 is a view illustrating an example of the opening 14 provided in the oxide insulating layer 4.
Figure 5:
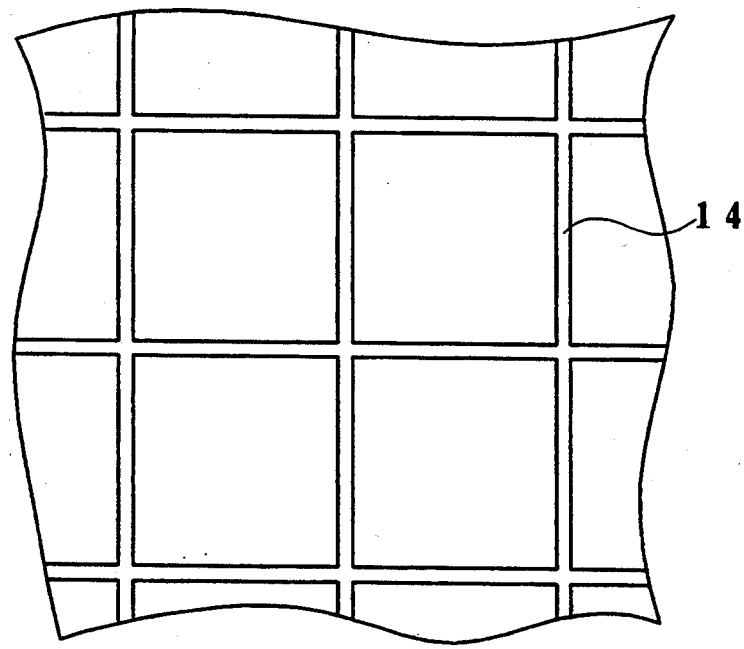
FIG. 5 is a view illustrating another example of the opening 14 provided in the oxide insulating layer 4.

Incidentally, the form of the openings 14 may be selected as appropriate to the required epitaxially grown layer 22. For example, they may be in the form of holes as shown in FIG. 4, or in lattice-like form as shown in FIG. 5. It may further be preferable that the direction of patterning the silicon dioxide layer 4 be <100>, which can prevent the occurrence of all faults.

Figure 3C:
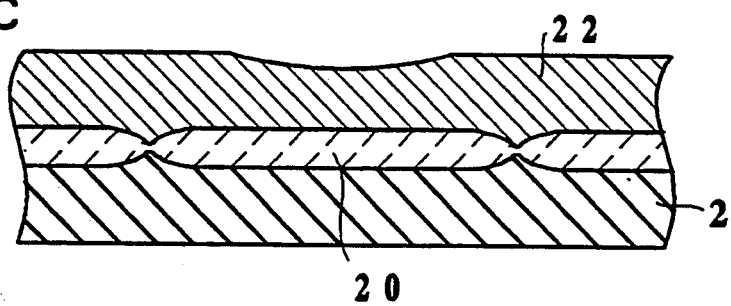

Moreover, if the steps shown in FIGS. 2 and 3 are added after the formation of devices in the epitaxially grown layer 22 in FIG. 3C, integrated circuits can be formed as a three-dimensional structure.

Figure 6:
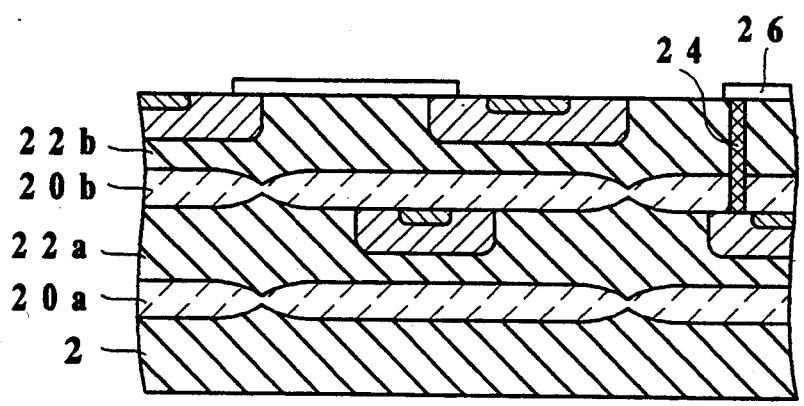
FIG. 6 is a view illustrating a semiconductor device formed in multilayer structure by the manufacturing method of the present invention.
Figure 7A:
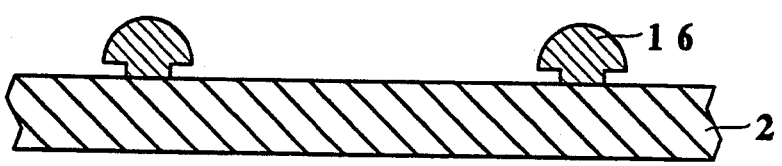
FIG. 7A-D is a view illustrating the method for manufacturing semiconductor device which is another embodiment of the present invention.
Figure 7B:
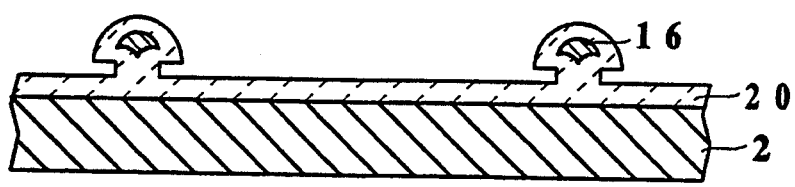
Figure 7C:
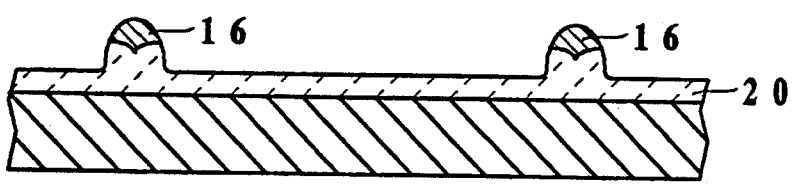
Figure 7D:
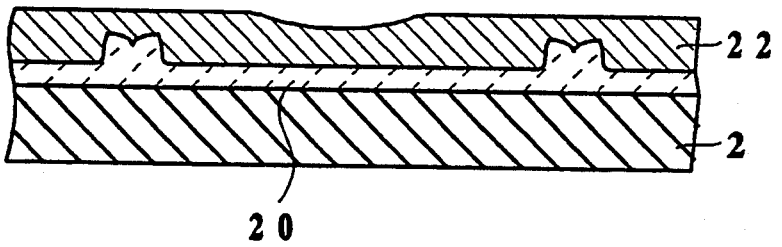

FIG. 6 illustrates an example of the integrated circuit thus obtained. In this case, a field oxide layer 20b is provided on the epitaxially grown layer 22a and an additional epitaxially grown layer 22b is provided thereon. This allows the resulting integrated circuit to be high in the degree of integration. In addition, to attach electrodes on a device formed in the epitaxially grown layer 22a, trenches may be provided to connect a device to an electrode 26 with the aid of polysilicon 24 or the like.

Although only two epitaxial layers are provided in FIG. 6, there may be three or more in a similar manner.

In the above embodiment, the surface of the seed crystal layer 16 is nitrified, at the step shown in FIG. 2F, to form the silicon nitride layer 18. However, this step may be substituted for by depositing a nitride layer using the CVD (Chemical Vapor Deposition) method or the like.

The barrier may be material, such as silicon carbide, having an oxidation rate sufficiently low as compared with that of the seed crystal layer 16.

In this embodiment, the silicon nitride layer 18 is formed on the seed crystal layer 16. However, when the thickness of the seed crystal layer 16 is sufficient, it is not necessary to form the silicon nitride layer 18. The steps for the case where the silicon nitride layer 18 is not formed are shown in FIG. 7. They are the same as those of FIGS. 2A through 2E extending to the point where the seed crystal layer 16 is made to grow in the opening 14. After the step shown in FIG. 2E, the silicon dioxide layer 4 is removed by etching. This step allows the silicon seed crystal layer 16 to remain in a mushroom shape. Then oxidation is carried out, so that the thinned portion of the silicon seed crystal layer 16 at its lower side is completely oxidized, into the state shown in FIG. 7B. This is followed by removing the oxidized layer on the top of the silicon seed crystal layer 16, into the state shown in FIG. 7C. Further, epitaxial growth is effected on the basis of the silicon seed crystal layer 16, with the result shown in FIG. 7D.

In the method shown in FIG. 7, formation of the silicon nitride layer 18 is not required, simplifying the processes involved.

In the method for manufacturing semiconductor device of the present invention, crystal growth is effected until the silicon seed crystal layer protrudes slightly from the opening of the oxide insulating layer, thus obtaining silicon seed crystal layers having the same plane bearing. Moreover, after a barrier is formed on the surface of the silicon seed crystal layer, oxidation is carried out so that the silicon seed crystal layer in the opening is oxidized, in order to cut off the connection between the silicon seed crystal layer and the silicon substrate. Subsequently, the silicon layer is grown out of the silicon seed crystal layer. As a result, a silicon grown layer can be obtained which is isolated from the silicon substrate and has a uniform plane bearing. In other words, the silicon grown layer can be formed without involving the pn junction with the silicon substrate, thus allowing the semiconductor device obtained to include a high-speed device. Also, the uniform plane bearing facilitates control during the formation of device components.

In the manufacturing methods of the present invention, after the opening formation step and before the seed crystal growth step, thin polysilicon layers or nitride silicon layers are formed on the oxide insulating layer of the opening sidewall. This arrangement serves to suppress any crystal faults from occurring to the opening sidewall during the crystal growth.

In the methods for manufacturing semiconductor device of the present invention, the steps extending from insulating layer formation to device formation are repeated a specified number of times on the silicon grown layer on which a semiconductor device is formed, to thereby obtain the silicon grown layers insulated by a specified number of oxide insulating layers. As a result, semiconductor device having a high degree of integration can be obtained as three-dimensional structure.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A semiconductor device which comprises:
    a) a silicon substrate having a surface;
    b) an insulating layer formed on the entire surface of said substrate, said insulting layer having a surface and including at least one bird's beak structure defined by a tapered connection formed between two portions of said insulating layer which have a substantially equal thickness which is greater than a thickness of said tapered connection therebetween;
    c) a first growth layer of silicon covering the entire surface of said insulating layer, said first growth layer having a same crystal plane orientation as said substrate; and
    d) a semiconductor element formed on said first growth layer.

2. A semiconductor device which comprises:
    a) a silicon substrate having a surface;
    b) an insulating layer formed on the entire surface of said substrate, said insulating layer having a surface and including at least one bird's beak structure defined by a tapered connection formed between two end portions of said insulating layer which have a substantially equal thickness which is greater than a thickness of said tapered connection therebetween;
    c) a first growth layer of silicon covering the entire surface of said insulating layer, said first growth layer having a same crystal plane orientation as said substrate;
    d) a semiconductor element formed on said first growth layer; and
    e) a second growth layer of silicon above a surface of said first growth layer, which second growth layer has a same crystal plane orientation as that of said substrate, said second growth layer further having a semiconductor element therein which is insulated from said first growth layer.

* * * * *